(12) United States Patent
Abe

(10) Patent No.: US 6,498,098 B1
(45) Date of Patent: Dec. 24, 2002

(54) METHOD OF FORMING EMBEDDED WIRING IN A GROOVE IN AN INSULATING LAYER

(75) Inventor: Kazuhide Abe, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/625,505

(22) Filed: Jul. 26, 2000

(30) Foreign Application Priority Data

Feb. 25, 2000 (JP) ........................................ 2000-049715

(51) Int. Cl.⁷ .......................................... H01L 21/4763
(52) U.S. Cl. ....................... 438/687; 438/622; 438/625; 438/628; 438/633; 438/660
(58) Field of Search ................................. 438/687, 688, 438/622, 623, 625, 626, 627, 628, 629, 631, 633, 635, 667, 668, 672, 675, 678, 680, 681, 685, 648, 660

(56) References Cited

U.S. PATENT DOCUMENTS 6,069,068 A * 5/2000 Rathore et al. ............. 438/628
6,086,960 A * 7/2000 Kim et al. .................. 427/534
6,126,806 A * 10/2000 Uzoh ......................... 205/183

FOREIGN PATENT DOCUMENTS

JP         5-6865     *   1/1993

OTHER PUBLICATIONS

Hoshino et al, "TiN–encapsulized copper interconnects for ULSI appliccations", VLSI Multilevel Interconnection Conference, 1989 Proceedings, 6th internation IEEE, pp 226–232.*

* cited by examiner

Primary Examiner—Tuan H. Nguyen
Assistant Examiner—Thanhha Pham
(74) Attorney, Agent, or Firm—Venable; Robert J. Frank; Ashley J. Wells

(57) ABSTRACT

According to the present invention, a semiconductor device is fabricated by: forming an insulation layer on a substrate; forming a groove in the surface of the insulation layer; forming a diffusion protection layer on the surface of the insulation layer including inside of the groove; forming a reaction layer on the diffusion protection layer; forming an oxide layer on the surface of the reaction layer; forming a layer of a wiring material on the oxide layer to embed the groove; forming a layer of a mixture of the reaction layer, the layer of the wiring material and the oxide layer by annealing; and removing the diffusion protection layer, the mixture layer and the layer of the wiring material from the surface of the insulation layer except for the diffusion protection layer, the mixture layer and the layer of the wiring material in the groove. By this fabrication method, the reaction of the wiring material such as copper and the underlying metal can be suppressed, thus suppressing the reduction in the cross-sectional size of the wiring material.

17 Claims, 13 Drawing Sheets

(a)

(b)

(c)

(d)

(a)

(b)

(c)

(a)

(b)

(c)

(a)

(b)

(c)

(a)

(b)

(a)

(b)

(c)

(d)

(a)

(b)

(c)

(a)

(a)

(b)

(c)

(a)

(b)

(a)

(b)

(c)

(d)

(a)

(b)

(c)

(a)

(b)

METHOD OF FORMING EMBEDDED WIRING IN A GROOVE IN AN INSULATING LAYER

BACKGROUND OF THE INVENTION

1. Field of the Invention

The present invention relates to a fabrication method for a semiconductor device, and in particular to a technique for forming embedded wiring in a groove formed in an insulation layer.

2. Description of the Related Art

In recent years, semiconductor devices have been made finer and therefore delay caused by resistance in wirings and capacitance formed in the wirings has become relatively larger, such that it cannot be ignored in signal delay in the semiconductor devices. For this reason, copper that has smaller specific resistance compared to that of aluminum alloys has been considered as material for the wirings.

The copper wirings are formed in the following manner.

First, an insulation layer is formed on a semiconductor substrate. Grooves corresponding to the shape of the wirings are then formed in the insulation layer by a known photolithography technique. Then, an adhesion layer, for example, a titanium layer is formed all over the insulation layer. On the titanium layer is formed a titanium nitride layer as a diffusion protection layer. After the titanium nitride layer has been formed, a titanium layer is deposited by sputtering onto the titanium nitride layer and a thin layer of copper is then deposited by sputtering onto the deposited titanium layer. Next, the grooves are completely embedded by plating with copper, the copper layer that has been deposited by sputtering. The copper layer deposited by sputtering and the underlying titanium layer is then annealed to react with each other. Then, all the metal layers on the insulation layer are removed by a CMP (Chemical Mechanical Polishing) method, and thus metal portions serving as the wirings only remain in the grooves.

SUMMARY OF THE INVENTION

Therefore, it is an object of the present invention to provide a method for forming embedded wiring that can suppress reaction of the material of the wiring such as copper and material of an underlying metal layer such as titanium in an annealing process, and can suppress reduction in the cross-sectional size of the wiring. This object is achieved by combinations described in the independent claims. The dependent claims define further advantageous and exemplary combinations of the present invention.

According to a first aspect of the present invention, a fabrication process for a semiconductor device, includes: forming an insulation layer on a substrate, forming a groove in the surface of the insulation layer, forming a diffusion protection layer on the surface of the insulation layer including inside of the groove, forming a reaction layer on the diffusion protection layer, forming an oxide layer on the surface of the reaction layer, forming a layer of a wiring material on the oxide layer to embed the groove, forming a layer of a mixture of the reaction layer, the layer of the wiring material and the oxide layer by annealing; and removing the diffusion protection layer, the mixture layer and the layer of the wiring material from the surface of the insulation layer except for the diffusion protection layer, the mixture layer and the layer of the wiring material in the groove.

In an embodiment of the present invention, the fabrication method further includes forming an adhesion layer for improving adhesion between the insulation layer and the diffusion protection layer. In this case, the diffusion protection layer is formed on the adhesion layer.

In another embodiment of the present invention, the formation of the layer of the wiring material includes: depositing a first wiring material on the oxide layer by sputtering, and forming a layer of a second wiring material on a layer of the first wiring material by plating.

In still another embodiment of the present invention, the reaction layer may be formed of at least one of Ti, Zr, Al, Mg, Si, Ag, Zn, Au, P, Sn, Be, Pd, In, Pt, Mn, Ga and Ge.

In still another embodiment of the present invention, the removal of the diffusion protection layer, the mixture layer and the layer of the wiring material except for the diffusion protection layer, the mixture layer and the layer of the wiring material in the groove is performed by chemical mechanical polishing.

In still another embodiment of the present invention the oxide layer is formed by exposing to the atmosphere, the substrate above which the reaction layer is formed.

In still another embodiment of the present invention, the oxide layer is formed by washing and scrubbing the reaction layer.

According to a second aspect of the present invention, a fabrication method for a semiconductor device includes: forming an insulation layer on a substrate, forming a groove in the surface of the insulation layer, forming a diffusion protection layer on the surface of the insulation layer including inside of the groove, forming an alloy layer containing a wiring material on the diffusion protection layer, forming a layer of the wiring material on the alloy layer to embed the groove, making the alloy layer and the layer of the wiring material react with each other by annealing; and removing the diffusion protection layer and the layer of the wiring material from the surface of the insulation layer except for the diffusion protection layer and the layer of the wiring material in the groove.

In an embodiment of the present invention, a thickness of the alloy layer is increased by the reaction of the alloy layer and the layer of the wiring material.

In another embodiment of the present invention, the alloy layer may contain two elements selected from the group consisting of the wiring material, Ti, Zr, Al, Mg, Si, Ag, Zn, Au, P, Sn, Be, Pd, In, Pt, Mn, Ga and Ge.

In still another embodiment of the present invention, the alloy layer may comprise two alloys, each of which two alloys contains three elements selected from the group consisting of the wiring material, Ti, Zr, Al, Mg, Si, Ag, Zn, Au, P, Sn, Be, Pd, In, Pt, Mn, Ga and Ge.

In still another embodiment of the present invention, the fabrication method further includes forming an oxide layer on the alloy layer, wherein the layer of the wiring material is formed on the oxide layer.

According to a third aspect of the present invention, a fabrication method for a semiconductor device includes: forming a layer of an organic low dielectric constant material on a substrate; forming a groove in the surface of the layer of the organic low dielectric constant material; forming a reaction layer on the surface of the layer of the organic low dielectric constant material including inside of the groove; forming an oxide layer on the surface of the reaction layer; forming a layer of a wiring material above the reaction layer on which the oxide layer has been formed so as to embed the groove; forming a layer of a mixture of the diffusion protection layer and the reaction layer by annealing; and removing the layer of the mixture and the layer of the wiring material away from the surface of the insulation layer except for the layer of the mixture and the layer of the wiring material in the groove.

According to a fourth aspect of the present invention, a fabrication method for a semiconductor device includes: forming a layer of an organic low dielectric constant material on a substrate; forming a groove in the surface of the layer of the organic low dielectric constant material; forming an alloy layer containing a wiring material on the layer of the organic low dielectric constant material including inside of the groove; forming a layer of the wiring material on the surface of the alloy layer to embed the groove; making the alloy layer and the layer of the wiring material react with each other by annealing; and removing the alloy layer and the layer of the wiring material on the surface of the insulation layer except for the alloy layer and the layer of the wiring material in the groove.

In an embodiment of the present invention, the fabrication method further includes forming an oxide layer on the alloy layer, wherein the layer of the wiring material is formed above the alloy layer on which the oxide layer has been formed.

According to a fifth aspect of the present invention, a fabrication method for a semiconductor device includes: forming an insulation layer on a substrate; forming a groove in the surface of the insulation layer; forming a titanium nitride layer that is stabilized on the surface of the insulation layer including inside of the groove; forming a coarse titanium nitride layer on the stabilized titanium nitride layer; oxidizing the surface of the coarse titanium nitride layer; forming a layer of a wiring material above the coarse titanium nitride layer on which an oxide layer has been formed so as to embed the groove; forming a layer of a mixture of the oxide layer and the layer of the wiring material by annealing; and removing the titanium nitride layer, the layer of the mixture and the layer of the wiring material from the surface of the insulation layer except for the titanium nitride layer, the layer of the mixture and the layer of the wiring material in the groove.

In an embodiment of the present invention, the stabilized titanium nitride layer is formed by repeating: deposition of a titanium nitride layer having a predetermined thickness by CVD and; a plasma treatment for the surface of the titanium nitride layer deposited by CVD, while the coarse titanium nitride layer is deposited by CVD.

In another embodiment of the present invention, the coarse titanium nitride layer is deposited by CVD using Tetra Di Methyl Amido Titanium as a material.

This summary of the invention does not necessarily describe all necessary features so that the invention may also be a sub-combination of these described features.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

The invention will now be described based on preferred embodiments, which do not intend to limit the scope of the present invention, but rather to exemplify the invention. All of the features and the combinations thereof described in the embodiments are not necessarily essential to the invention.

Embodiment 1

Referring to FIGS. 1A–1D, 2A–2C and 3A–3C, the first embodiment of the present invention is described in detail.

Figure 1:
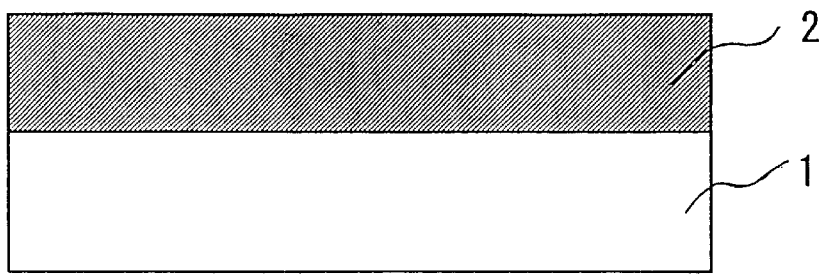
FIGS. 1A, 1B, 1C and 1D are cross-sectional views showing processes in a fabrication method according to a first embodiment of the present invention.
Figure 1:
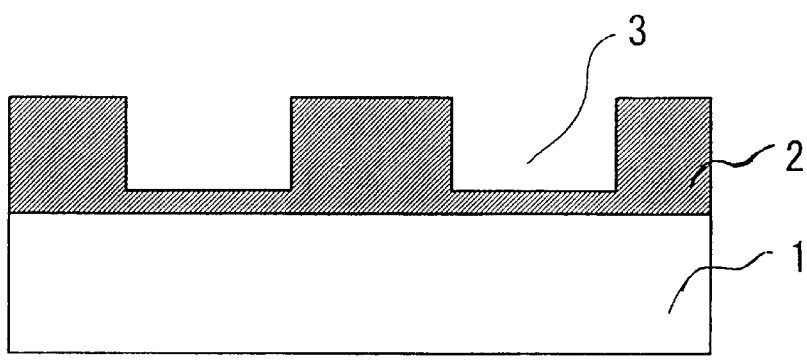
Figure 1:
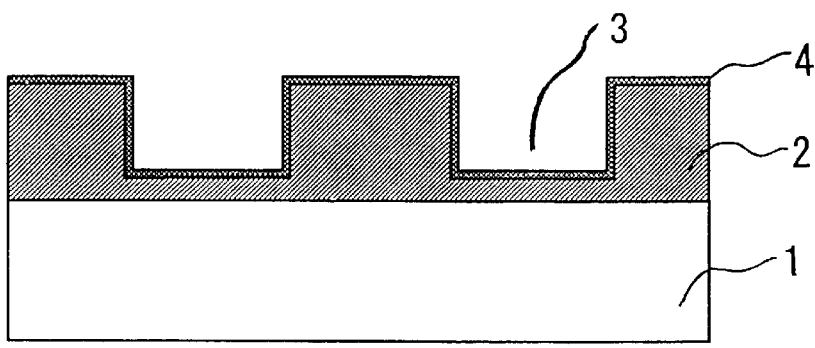
Figure 1:
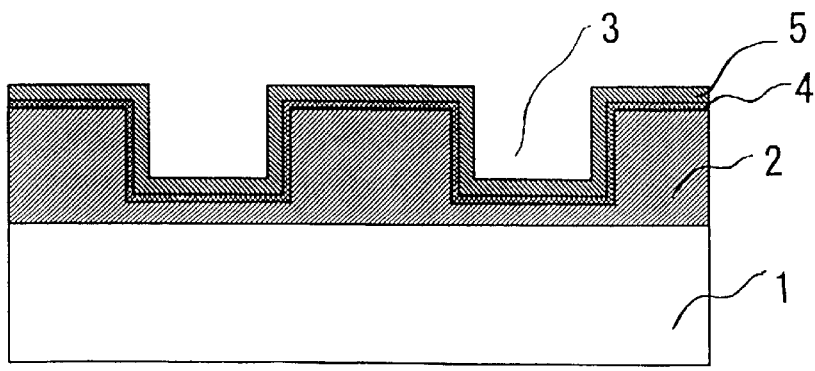

On a semiconductor substrate 1 such as a silicon substrate, an insulation layer 2 is formed, as shown in FIG. 1A. The insulation layer 2 is a layer of silicon oxide, for example.

Next, grooves 3 are formed in the insulation layer 2 by a known photolithography technique, as shown in FIG. 1B. The grooves 3 are formed in areas corresponding to a pattern of wirings that are to be formed in the insulation layer 2. The grooves 3 are formed having a depth of 0.5 $\mu$m and a width of 0.36 $\mu$m, for example.

A thin layer of titanium 4 and a thin layer of titanium nitride 5 are then formed, as shown in FIGS. 1C and 1D. The titanium layer 4 has a function of improving adhesion of the titanium nitride layer 5 to the insulation layer 2. The titanium nitride layer 5 serves as a diffusion protection layer that prevents metal formed on the titanium nitride layer 5 from diffusing into the insulation layer 2.

In this embodiment, the titanium layer 4 and the titanium nitride layer 5 are formed with a thickness of 10 nm and a thickness of 40 nm, respectively. The titanium layer 4 and the titanium nitride layer 5 are successively deposited in a vacuum by directivity-improved sputtering.

In directivity-improved sputtering in which the directivity is improved, a substrate on which deposition is to be performed is positioned away from a target by, for example, 10 cm or more, in order to allow only atoms sputtered in a perpendicular direction to the substrate to be deposited on the substrate. Such sputtering can improve the result of covering steps, compared with a conventional technique of sputtering.

Although the titanium layer is used as the adhesion layer in this embodiment, a layer of another metal that can react with copper, such as tantalum (Ta) or zirconium (Zr), may be used as the adhesion layer. In addition, the adhesion layer may be formed by CVD.

As the material for the diffusion protection layer, instead of titanium nitride, other metal nitride such as tantalum nitride (TaNx), zirconium nitride (ZrNx) or tungsten nitride (WNx) can be used. It should be noted that the diffusion protection layer may be formed by CVD.

Figure 2:
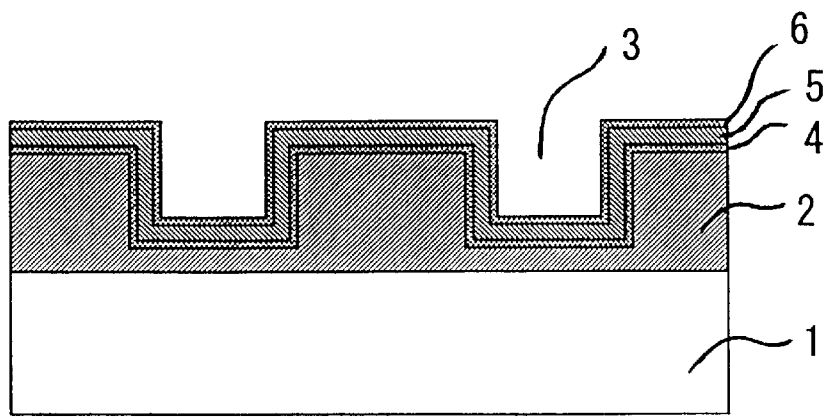
FIGS. 2A, 2B and 2C are cross-sectional views showing processes following the processes shown in FIGS. 1A–1D in the fabrication method according to the first embodiment of the present invention.
Figure 2:
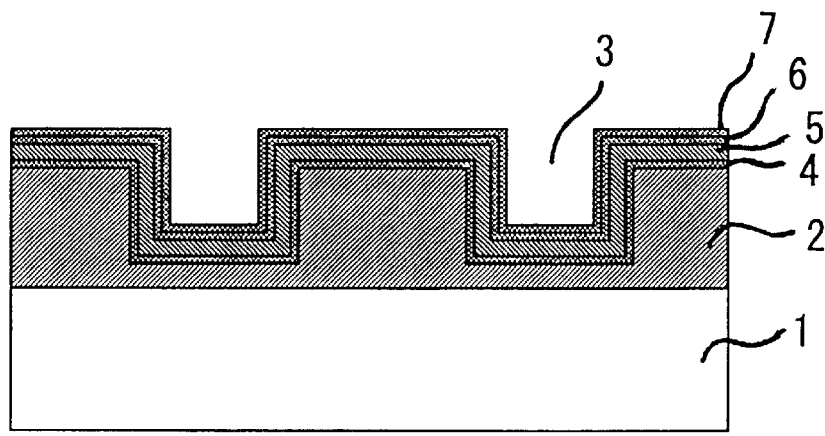
Figure 2:
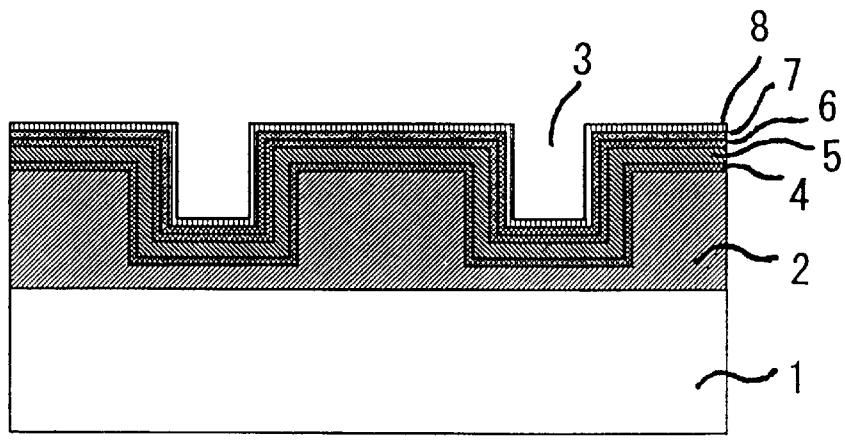

Next, a thin layer of titanium 6 serving as a reaction layer is formed on the titanium nitrate layer 5 as the diffusion protection layer, as shown in FIG. 2A. The titanium layer 6 is deposited by directivity-improved sputtering, to have a thickness of 20 nm, for example. Alternatively, zirconium (Zr), magnesium (Mg), aluminum (Al), boron (B) or silicon (Si) may be used as the material for the reaction layer, but no copper (Cu).

The titanium layer 6 as the reaction layer is formed in a vacuum successively with the titanium layer 4 as the adhesion layer and the thin titanium nitride layer 5 as the diffusion protection layer.

Then, the surface of the titanium layer 6 as the reaction layer is exposed to the atmosphere for about 24 hours, as shown in FIG. 2B. This makes the surface of the titanium layer 6 oxidize, and thus a layer of titanium oxide 7 is formed on the surface of the titanium layer 6. The oxide layer 7 is formed to a thickness such that the surface of the titanium layer 6 is continuously covered.

A thin layer of copper 8 is then formed on the oxide layer 7 to a thickness of 120 nm, as shown in FIG. 2C. This copper layer 8 is to be used as a seed layer for electroplating. In this embodiment, the copper layer 8 is deposited by directivity improved sputtering.

Figure 3:
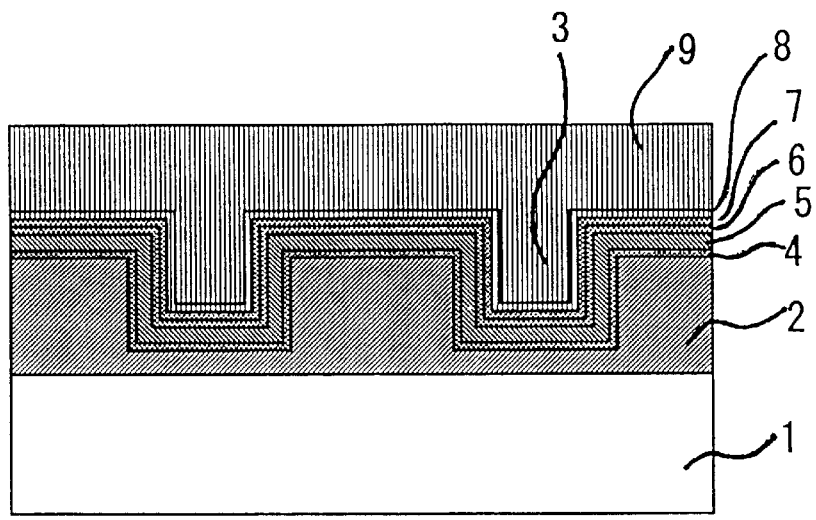
FIGS. 3A, 3B and 3C are cross-sectional views showing processes following the processes shown in FIGS. 2A–2C in the fabrication method according to the first embodiment of the present invention.
Figure 3:
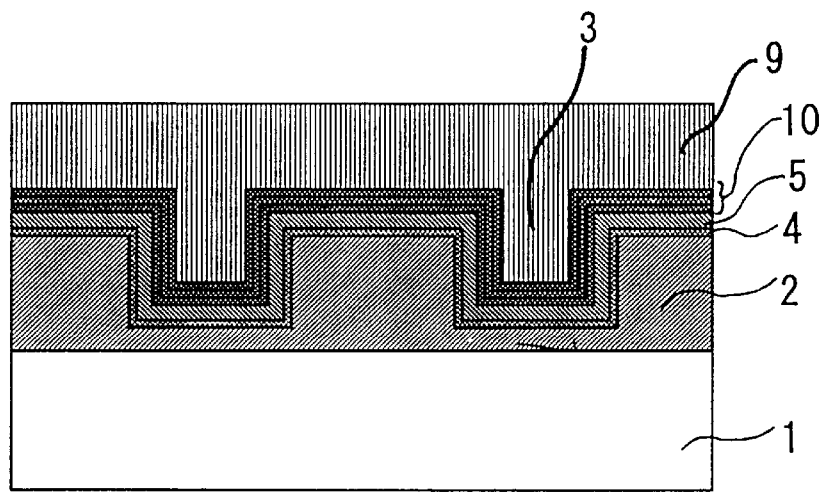
Figure 3:
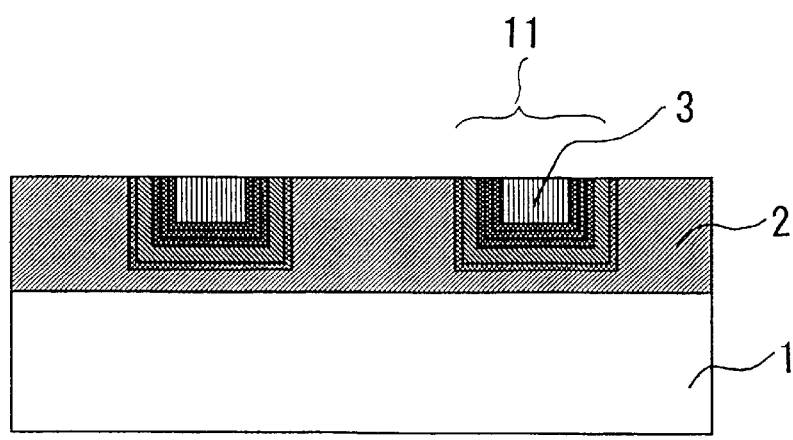

Subsequently, a thin layer of copper 9 is formed on the copper layer 8 by electroplating, as shown in FIG. 3A. This copper layer 9 is formed in such a manner that the grooves 3 are completely embedded.

After the copper layer 9 has been formed, the substrate is then annealed at a temperature of 450° C. for 30 minutes in a mixed atmosphere of hydrogen and oxygen, as shown in FIG. 3B. By performing this annealing process, the copper layer 8 as the seed layer reacts with the titanium layer 6 as the reaction layer, and thus a layer 10 of a mixture of copper, titanium and oxygen is formed.

In the present embodiment, the titanium oxide layer 7 is formed between the titanium layer 6 and the copper layer 8.

Thus, the reaction of the titanium layer 6 and the copper layer 8 is suppressed in the annealing process, resulting in prevention of excessive reduction in the cross-sectional size of the copper layer 9.

In FIG. 3B, an example is shown in which only the copper layer 8 as the seed layer reacts with the titanium layer 6. However, the reaction is not limited to the above. Alternatively, a part of the copper layer 9 that has been formed by electroplating may react with the titanium layer 6.

Next, the metal layers on the surface of the insulation layer 2 are polished by a CMP method for complete removal. As a result, the surface of the insulation layer 2 is exposed, and a conductive layer 11 only remains in each groove 3. This conductive layer 11 can be used as the wiring. In the CMP method used in the present embodiment, an $Al_2O_3$-based slurry to which $H_2O_2$ is added as an oxidizing agent is used. A down force for a carrier is 3 psi and rotation speeds of the carrier and a platen are 100 rpm and 100 rpm, respectively. The substrate 1 is held by the carrier and is polished with the platen, serving as abrasive cloth, while being pushed toward the platen. The pushing force applied to the substrate 1 and the platen is the down force. In the polishing process, both the carrier and the platen are rotated.

In the first embodiment described above, an example in which the oxide layer 7 is formed by exposing the titanium layer 6 as the reaction layer to the atmosphere is described. However, the method for forming the oxide layer is not limited to the above. For example, the oxide layer can be formed by washing and scrubbing the titanium layer 6 for about one to two minutes. In this case, the period required for forming the oxide layer can be shortened compared with the case where the oxide layer is formed by exposing the thin titanium layer 6 to the atmosphere.

In the case of washing and scrubbing the titanium layer 6, the surface of a wafer is placed in a stream of water while being scrubbed with a brush as a scrubber. As the scrubber used here, one that is typically used for removing particles from the surface of the wafer can be used.

Embodiment 2

The second embodiment of the present invention is described, referring to FIGS. 4A–4C, 5A and 5B.

In FIGS. 4A–4C, 5A and 5B, parts that are the same as those described in the first embodiment are labeled with the same reference numerals, and the description thereof is omitted in the present embodiment.

Figure 4:
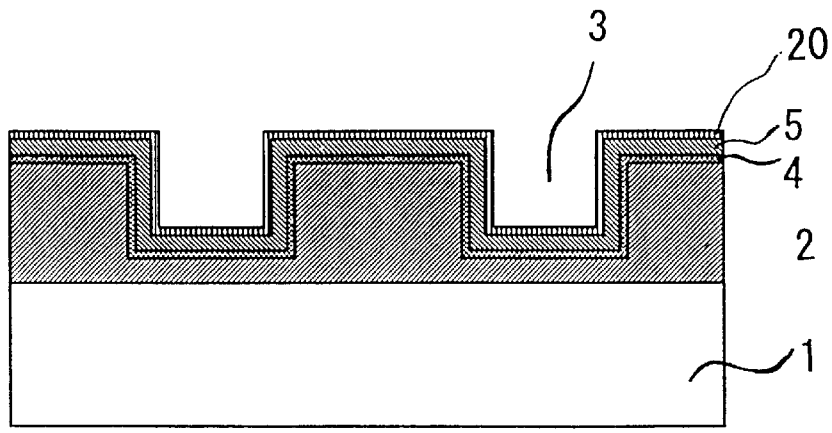
FIGS. 4A, 4B and 4C are cross-sectional views showing processes in a fabrication method according to a second embodiment of the present invention.
Figure 4:
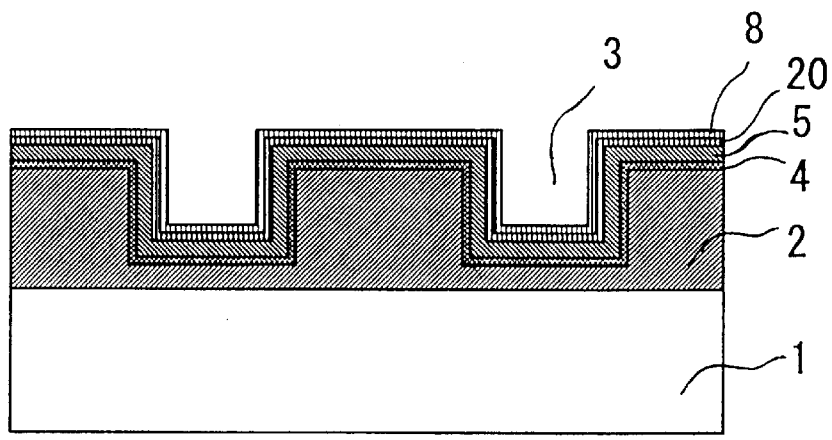
Figure 4:
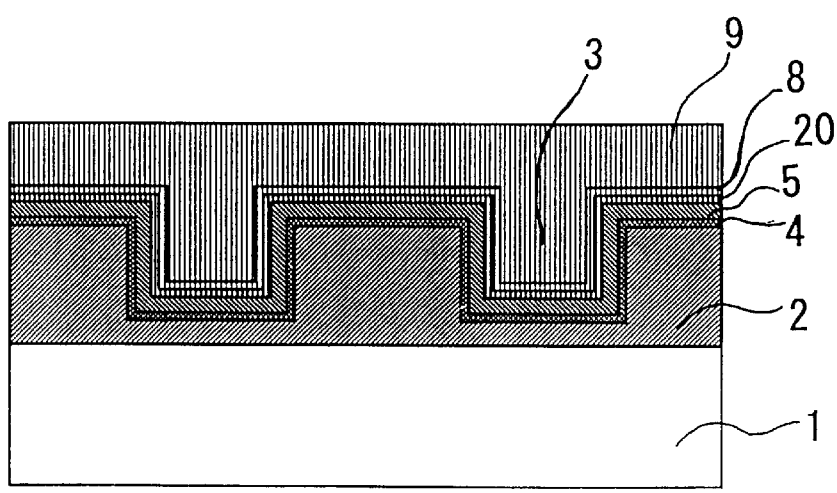

FIG. 4A shows a state in which a copper-titanium alloy layer (CuTi alloy layer) 20 is formed after the insulation layer 2, the grooves 3, the titanium layer 4 as the adhesion layer and the titanium nitride layer 5 as the diffusion protection layer are formed on the semiconductor substrate 1.

The CuTi alloy layer 20 is deposited on the titanium nitride layer 5 by sputtering using a CuTi 0.5 wt % target.

Although an example in which the CuTi alloy layer is used as the reaction layer is described in the present embodiment, the material for the reaction layer is not limited to this. For example, other binary compounds such as CuZr, CuNi, CuAl, CuMg, or CuSi or a ternary compound that is obtained by combining materials that easily react with copper, such as CuTiSi or CuZrSi can be used.

On the CuTi alloy layer 20, thin layers of copper 8 and 9 are formed, as shown in FIGS. 4B and 4C.

Figure 5:
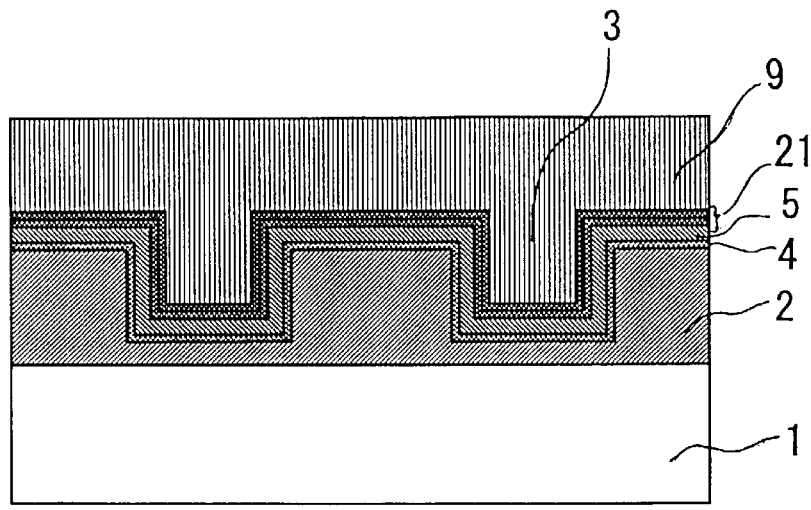
FIGS. 5A and 5B are cross-sectional views showing processes following the processes shown in FIGS. 4A–4C in the fabrication method according to the second embodiment of the present invention.
Figure 5:
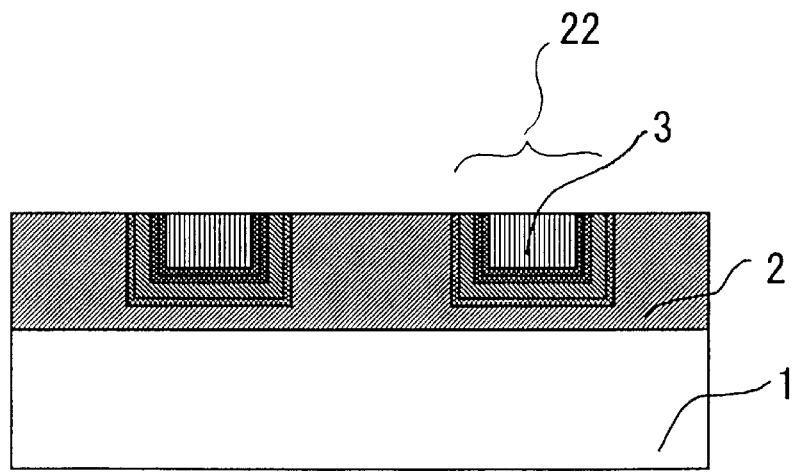

After the thin copper layer 9 has been formed, the substrate is subjected to an annealing process at a temperature of 450° C. for 30 minutes in an atmosphere of hydrogen and oxygen. This annealing process makes the copper layer 8 as the seed layer and the CuTi alloy layer 20 as the reaction layer react with each other, thus increasing the thickness of the CuTi alloy layer, as shown in FIG. 5A. In FIG. 5A, the reference numeral 21 denotes the CuTi alloy layer having the increased thickness.

Then, the metal layers on the surface of the insulation layer 2 are polished by a CMP method, and thus the surface of the insulation layer 2 is exposed. Subsequently, a conductive layer 22 only remains in each of the grooves 3. The conductive layer 22 can be used as the wiring. In the present embodiment, the polishing process using the CMP method is performed under the same conditions as those in the first embodiment.

As described above, the CuTi alloy layer is used as the reaction layer in the present embodiment. Thus, the amount of titanium that reacts with the copper layer 8 or 9 can be decreased, resulting in a decrease of the amount of copper consumed in the reaction caused by the annealing process. Therefore, the reduction in the cross-sectional size of the copper layer in the conductive layer 22 can be suppressed.

In the present embodiment, an oxide layer (not shown) may be formed on the CuTi layer 20 before the copper layer 8 is formed. In this case, the oxide layer is formed by exposing the semiconductor substrate to the atmosphere for about 24 hours, after the CuTi layer 20 has been formed, or by washing and scrubbing the semiconductor substrate after the CuTi layer 20 has been formed.

In this case, the oxide layer can suppress the reaction of the copper layer and the CuTi alloy layer 20, thus further suppressing the reduction in the cross-sectional size of the copper layer caused by the annealing process.

Embodiment 3

The third embodiment of the present invention is described referring to FIGS. 6A–6D, 7A–7C and 8.

In FIGS. 6A–6D, 7A–7C and 8, parts that are the same as those described in the first embodiment are labeled with the same reference numerals, and the description thereof is omitted in the present embodiment.

Figure 6:
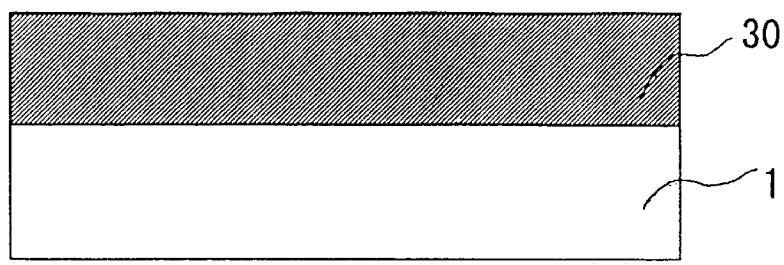
FIGS. 6A, 6B, 6C and 6D are cross-sectional views showing processes in a fabrication method according to a third embodiment of the present invention.
Figure 6:
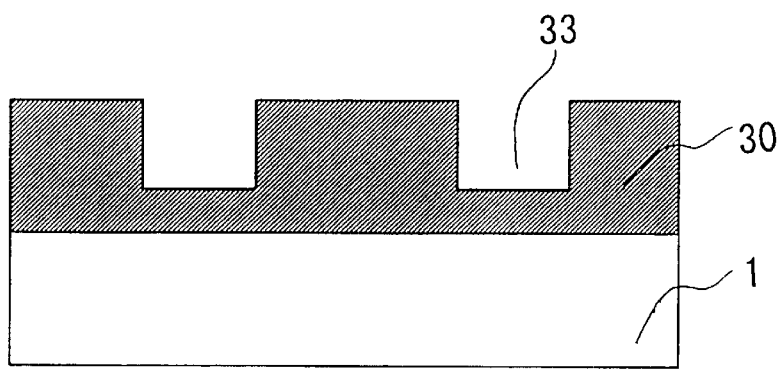
Figure 6:
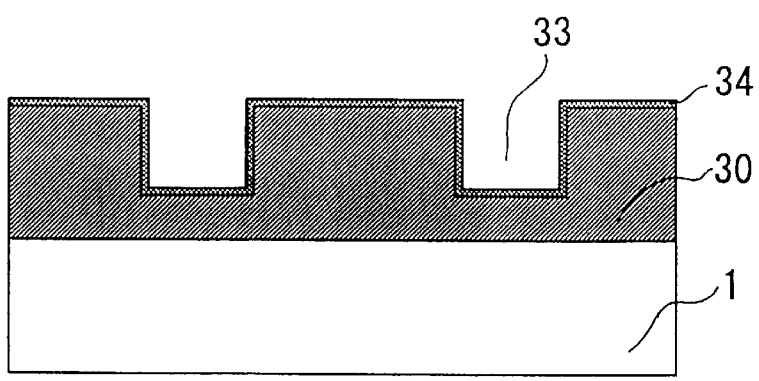
Figure 6:
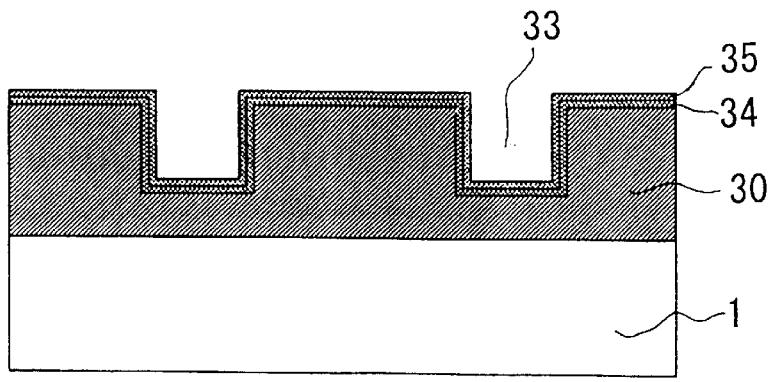

In FIG. 6A, the semiconductor substrate 1 is formed of, for example, silicon. On the semiconductor substrate 1, a layer 30 of organic low dielectric constant material serving as the insulation layer is formed. As the organic low dielectric constant material, BCB (benzo-cyclo-butene) can be used, for example.

The organic low dielectric constant material layer 30 is formed on the semiconductor substrate 1 by spin coating.

Next, grooves 33 are formed in the organic low dielectric constant material layer 30 using a known photolithography technique and a known etching technique, as shown in FIG. 6B. The grooves 33 are provided in areas corresponding to a pattern of wirings that are to be formed in the organic low dielectric constant material layer 3. The grooves 33 are formed with a depth of 0.5 µm and a width of 0.36 µm, for example.

A thin layer of titanium 34 is then formed as the reaction layer, as shown in FIG. 6C.

In the present embodiment, the titanium layer 34 is deposited with a thickness of 20 nm by directivity-improved sputtering. As the material for the reaction layer, zirconium (Zr), magnesium (Mg), aluminum (Al), boron (B) or silicon (Si) can be used instead of titanium.

A titanium oxide layer 35 is then formed on the surface of the titanium layer 34 serving as the reaction layer, as shown in FIG. 6D. The titanium oxide layer 35 is formed by exposing the surface of the titanium layer 34 to the atmosphere for about 24 hours in order to form a thickness such that that the titanium oxide layer 35 covers the titanium layer 34 continuously.

Figure 7:
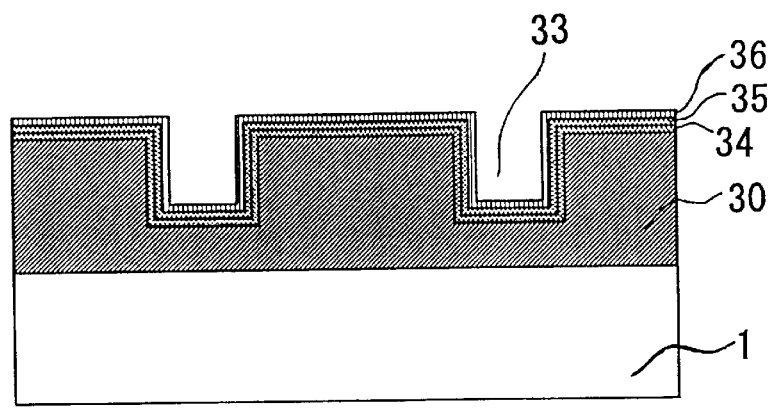
FIGS. 7A, 7B and 7C are cross-sectional views showing processes following the processes shown in FIGS. 6A–6D in the fabrication method according to the third embodiment of the present invention.
Figure 7:
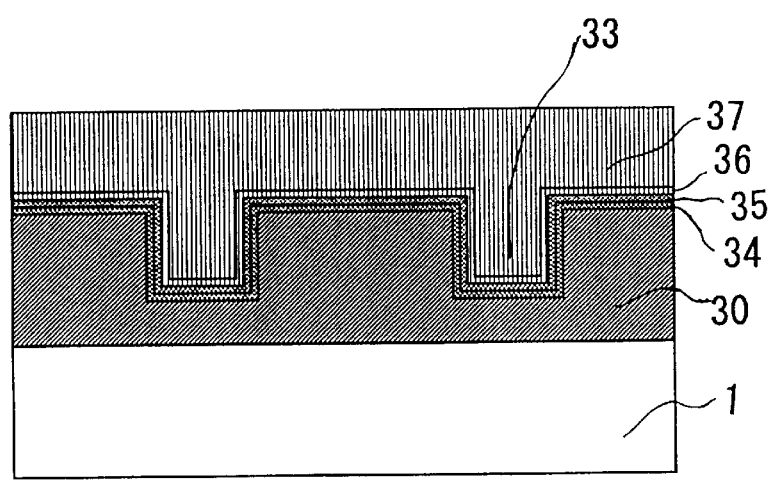
Figure 7:
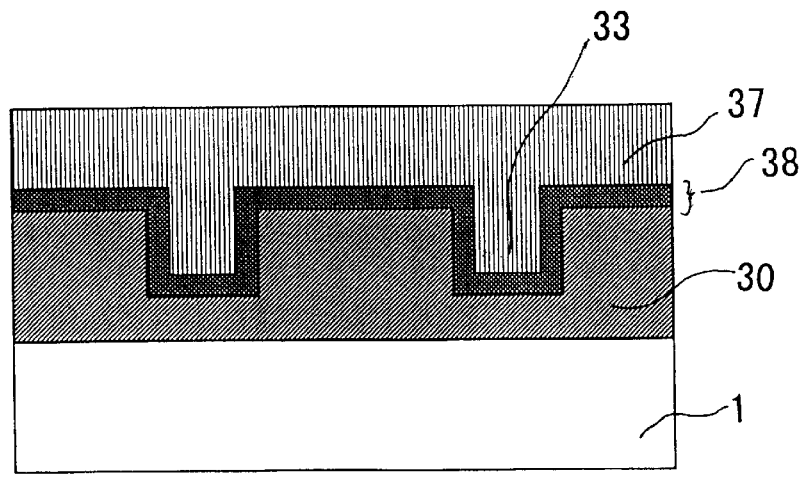
Figure 8:
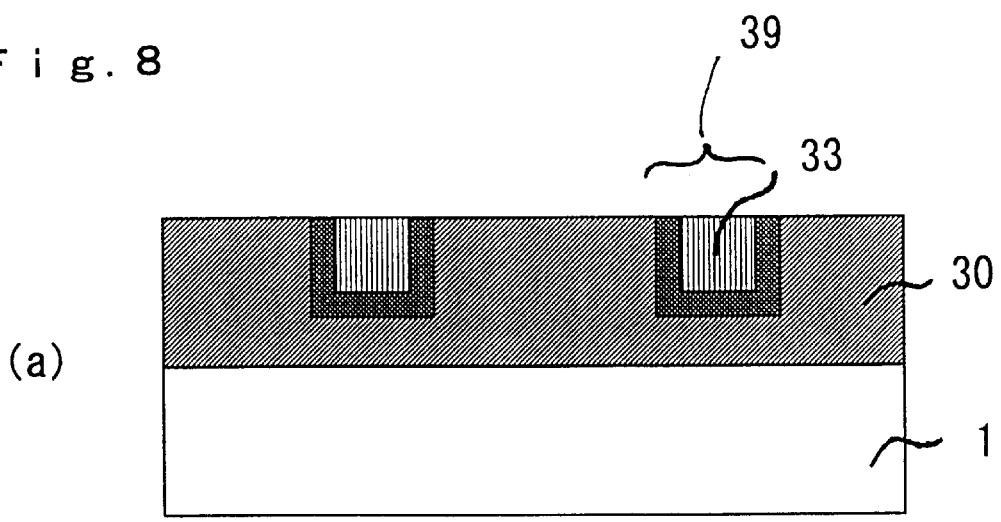
FIG. 8 is a cross-sectional view showing a process following the processes shown in FIGS. 7A–7D in the fabrication method according to the third embodiment of the present invention.

After the oxide layer 35 is formed on the titanium layer 34, a thin layer of copper 36 is formed with a thickness of 120 nm, as shown in FIG. 7A. This copper layer 36 is to be used as the seed layer for electroplating, and is deposited by sputtering having an improved directivity.

A thin layer of copper 37 is then formed on the copper layer 36 by electroplating, as shown in FIG. 7B. This copper layer 37 is formed in such a manner that the grooves 33 are completely embedded.

Next, after the copper layer 37 has been formed, the substrate is annealed at a temperature of 450° C. for 30 minutes in a mixed atmosphere of hydrogen and oxygen. This annealing process makes the copper layer 36 as the seed layer and the titanium layer 34 as the reaction layer react with each other, so as to form a layer 38 of a mixture containing copper, titanium and oxygen.

In the present embodiment, the titanium oxide layer 35 is provided between the titanium layer 34 and the copper layer 36. Thus, the reaction of the titanium layer 34 and the copper layer 36 in the annealing process can be suppressed. As a result, excessive reduction in the cross-sectional size of the copper layer 37 can be suppressed.

In FIG. 7C, an example in which only the copper layer 36 serving as the seed layer reacts with the titanium layer 34 is described. However, the reaction is not limited to the above. A part of the copper layer 37 formed by electroplating may react, for example.

The metal layers on the insulation layer 30 are then polished by a CMP method in order to be removed, and thus the surface of the insulation layer 30 is exposed. As a result, only a conductive layer 39 remains only in each groove 33. This conductive layer 39 can be used as the wiring. In the polishing process using the CMP method, the $Al_2O_3$-based slurry to which $H_2O_2$ is added as the oxidizing agent is used. The down force for the carrier is 3 psi; and the rotation speeds of the carrier and the platen are 100 rpm and 100 rpm, respectively.

In the third embodiment, an example in which the oxide layer 35 is formed by exposing the titanium layer 34 as the reaction layer to the atmosphere is described. However, the method for forming the oxide layer is not limited to the above. For example, the oxide layer can be formed by washing and scrubbing the titanium layer 34. In this case, the period required for forming the oxide layer can be shortened.

Embodiment 4

The fourth embodiment of the present invention is described with reference to FIGS. 9A–9C, 10A and 10B.

In FIGS. 9A–9C, 10A and 10B, parts that are the same as those described in the third embodiment are labeled with the same reference numerals, and the description thereof is omitted in the present embodiment.

Figure 9:
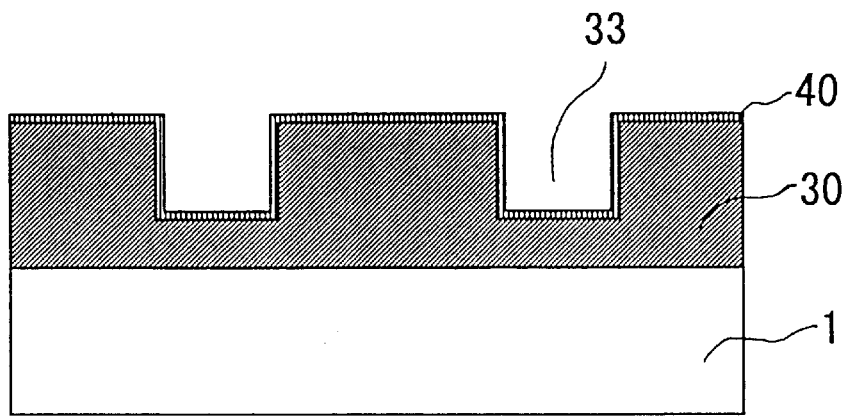
FIGS. 9A, 9B and 9C are cross-sectional views showing processes in a fabrication method according to a fourth embodiment of the present invention.
Figure 9:
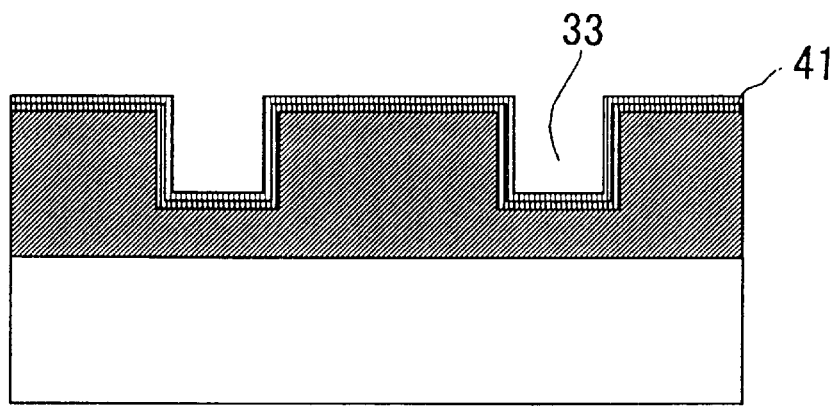
Figure 9:
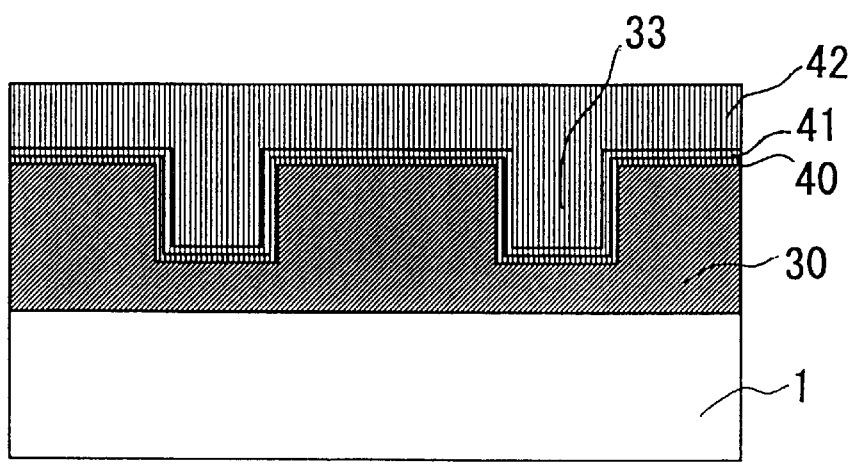

FIG. 9A shows a state in which the organic low dielectric constant material layer 30, the grooves 33 and a CuTi alloy layer 40 are formed on the semiconductor substrate 1.

The CuTi alloy layer 40 is deposited on the organic low dielectric constant material layer 30 by sputtering using a CuTi 0.5 wt % target.

An example in which the CuTi alloy layer is used as the reaction layer is described in the fourth embodiment.

However, the material for the reaction layer is not limited thereto. Alternatively, other binary compounds such as CuZr, CuNi, CuAl, CuMg or CuSi, or ternary compounds such as CuTiSi or CuZrSi are suitable.

Thin layers of copper 41 and 42 are then formed on the CuTi alloy layer 40, as shown in FIGS. 9B and 9C.

Figure 10:
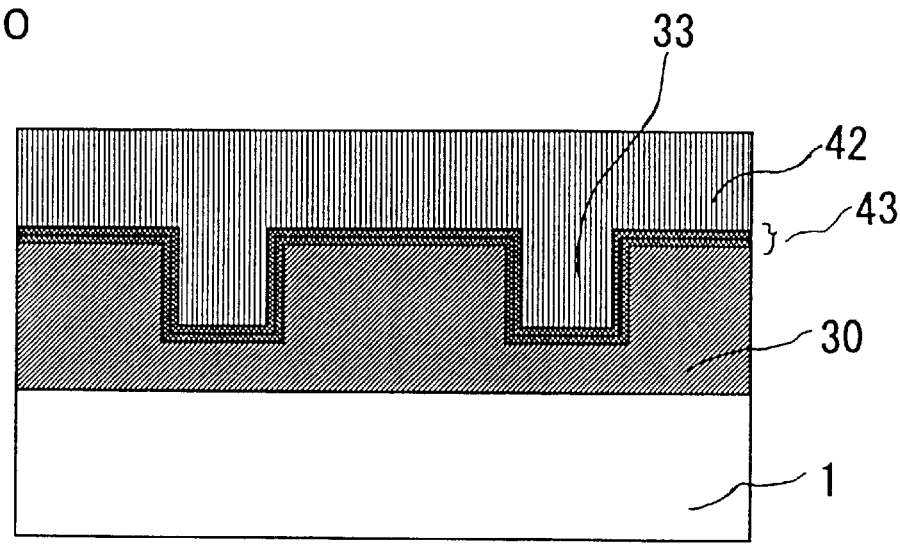
FIGS. 10A and 10B are cross-sectional views showing processes following the processes shown in FIGS. 9A–9C in the fabrication method according to the fourth embodiment of the present invention.
Figure 10:
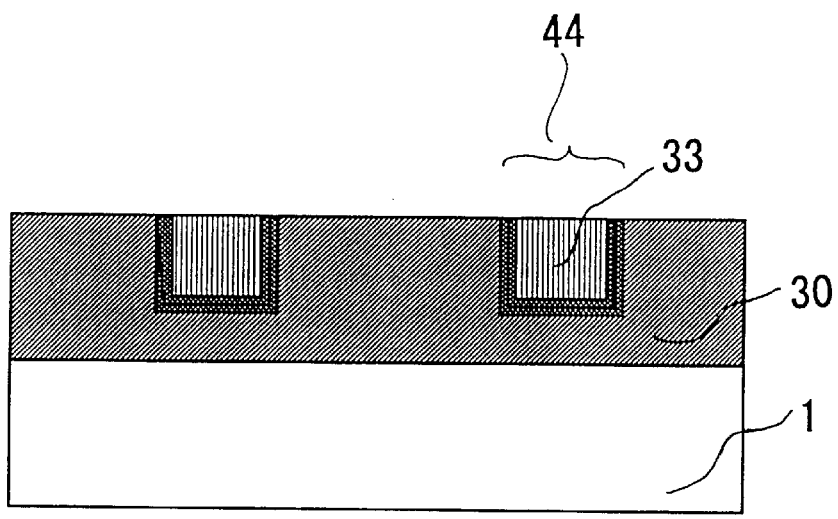

Next, after the copper layer 42 has been formed, the substrate is annealed at a temperature of 450° C. for 30 minutes in an atmosphere of a mixture of hydrogen and oxygen, as shown in FIG. 10A. This annealing process makes the copper layer 41 as the seed layer and the CuTi alloy layer 40 as the reaction layer react with each other, thus increasing the thickness of the CuTi alloy layer. In FIG. 10A, the reference numeral 43 denotes the CuTi alloy layer having an increased thickness.

The metal layers on the surface of the organic low dielectric constant material layer 30 are then polished by a CMP method in order to be removed, and thus the surface of the organic low dielectric constant material layer 30 is exposed. As a result, a conductive layer 44 only remains in each groove 33. This conductive layer 44 can be used as the wiring. In the present embodiment, the conditions in the polishing process using the CMP method are the same as those in the first embodiment.

The amount of titanium that reacts with the copper layer 41 or 42 can be decreased by using the CuTi alloy layer as the reaction layer, as described above, resulting in a decrease in the amount of copper consumed in the reaction caused by the annealing process. Therefore, reduction in the cross-sectional size of the copper layer in the conductive layer can be suppressed.

In the present embodiment, an oxide layer (not shown) may be formed on the CuTi alloy layer 40 before the copper layer 41 is formed. In this case, the oxide layer is formed by exposing the semiconductor substrate having the CuTi alloy layer 40 formed thereon to the atmosphere for about 24 hours or by washing and scrubbing it.

In this case, the reaction of the copper layer and the CuTi alloy layer 40 can be suppressed by the oxide layer and therefore reduction in the cross-sectional size in the copper layer caused by the annealing process can be further suppressed.

Embodiment 5

Next, the fifth embodiment of the present invention is described referring to FIGS. 11A–11D, 12A–12C, 13A and 13B.

In FIGS. 11A–11D, 12A–12C, 13A and 13B, parts that are the same as those described in the first to fourth embodiment are labeled with the same reference numerals, and the description thereof is omitted in the present embodiment.

Figure 11:
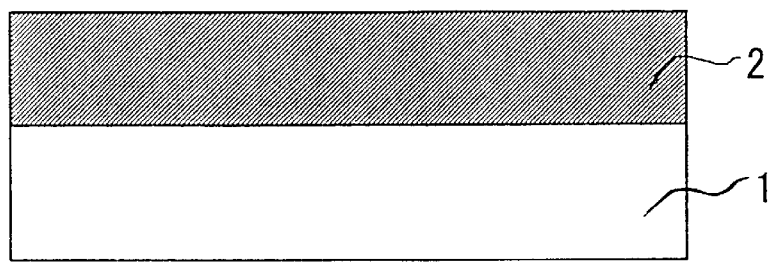
FIGS. 11A, 11B, 11C and 11D are cross-sectional views showing processes in a fabrication method according to a fifth embodiment of the present invention.
Figure 11:
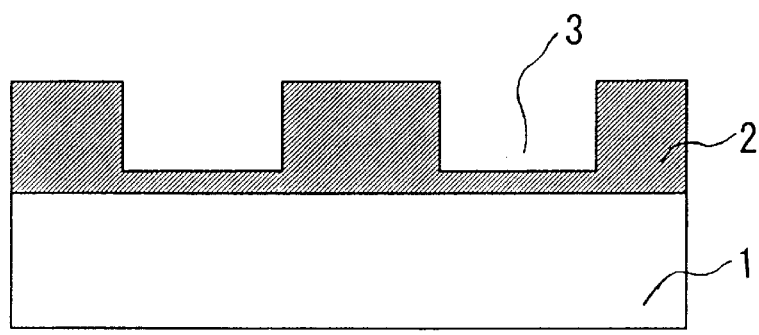
Figure 11:
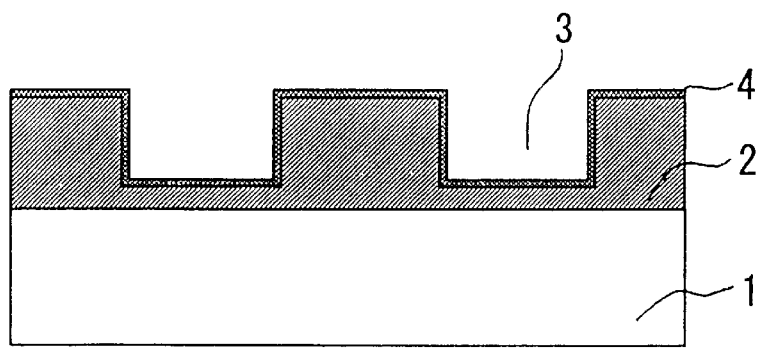
Figure 11:
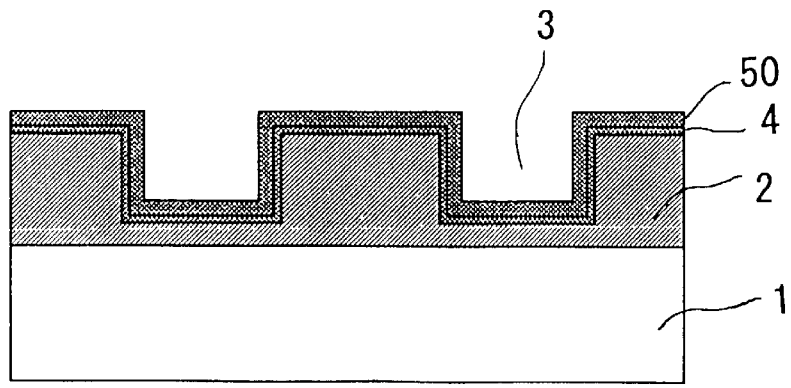

FIGS. 11A to 11C show processes for forming the insulation layer 2, the grooves 3 and the titanium layer 4 on the semiconductor substrate 1, respectively. These processes are the same as those in the first embodiment and the detailed description thereof is omitted here.

After the titanium layer 4 has been formed, a layer of titanium nitride 50 is formed on the titanium layer 4, as shown in FIG. 11D. The titanium nitride layer 50 is deposited by CVD method, to have a thickness of 20 nm.

A specific formation process for forming the titanium nitride layer 50 in the present embodiment is described.

The titanium nitride layer 50 is deposited using TDMAT (Tetra Di Methyl Amido Titanium) as material in a chamber, at a temperature of 420° C., and a chamber pressure of 0.5 mTorr. TDMAT is vaporized with a vaporizer and is then supplied to the chamber using He (helium) as a carrier gas. As a dilution gas used in the deposition, $N_2$ (nitrogen) gas is used. When the thickness of the deposited titanium nitride layer reaches 5 nm, a $N_2+H_2$ plasma treatment or an $NH_3$ plasma treatment is performed.

When the thickness of the deposited titanium nitride layer increases by 5 nm after the above plasma treatment has been performed, the above plasma treatment is performed again. This plasma treatment is performed for the purpose of stabilizing the titanium nitride layer deposited by CVD. These steps are repeated until the thickness of the titanium nitride layer reaches 20 nm. However, the plasma treatment is not performed once the thickness of the titanium nitride layer reaches 20 nm.

The conditions in the plasma treatment can be set in such a manner that the RF power is 500 W, the frequency is 13.56 MHz, the period is one minute, and the $N_2$ flow rate and $H_2$ flow rate are 500 sccm and 1500 sccm, respectively, in the case of using $N_2+H_2$ gas, or an $NH_3$ flow rate of 1000 sccm in the case of using $NH_3$ gas.

Figure 12:
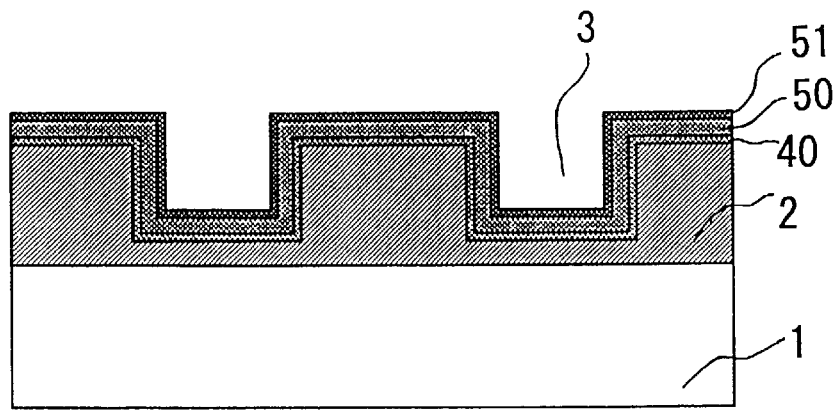
FIGS. 12A, 12B and 12C are cross-sectional views showing processes following the processes shown in FIGS. 11A–11D in the fabrication method according to the fifth embodiment of the present invention.
Figure 12:
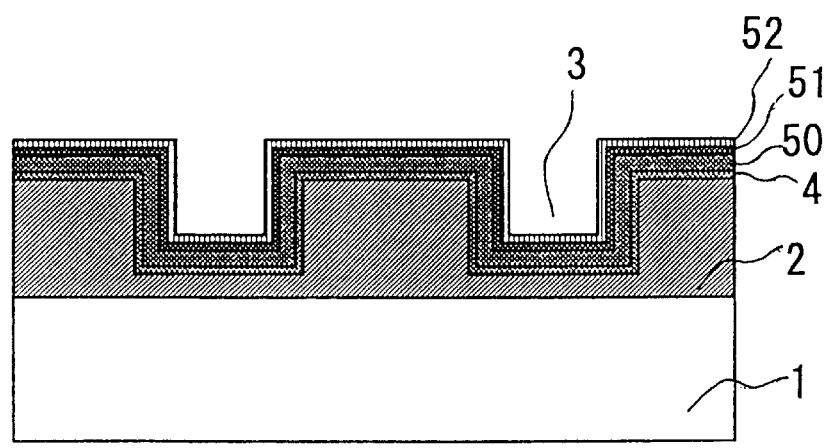
Figure 12:
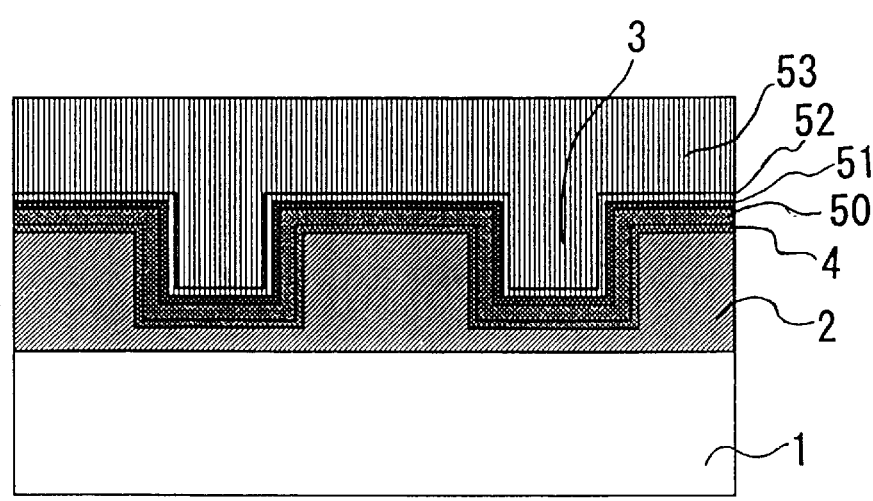

Next, a titanium oxide layer 51 is formed on the surface of the titanium nitride layer 50, as shown in FIG. 12A. The oxide layer 51 is deposited by retrieving the substrate 1 from the deposition chamber of a sputtering device after the titanium nitride layer 50 has been formed, and then exposing the surface of the deposited titanium nitride layer to the atmosphere. Since the surface of the titanium nitride layer deposited using TDMAT is coarse, the surface of the titanium nitride layer is oxidized by being exposed to the atmosphere at room temperature. For this reason, the plasma treatment is not performed once the total thickness of the titanium nitride layer reaches 20 nm, that is, after the uppermost layer of titanium nitride is formed.

A thin layer of copper 52 is then formed on the oxide layer 51, with a thickness of 120 nm, as shown in FIG. 12B. This copper layer 52 is to be used as the seed layer for electroplating. The copper layer 52 is deposited by directivity-improved sputtering.

A thin layer of copper 53 is then formed on the copper layer 52 by electroplating, as shown in FIG. 12C. The copper layer 53 is formed to have a thickness such that the grooves 3 are completely embedded.

Next, after the copper layer 53 has been formed, the substrate is annealed at a temperature of 450° C. for 30 minutes in a mixed atmosphere of hydrogen and oxygen. This annealing process makes the copper layer 52 as the seed layer and the oxide layer 51 react with each other, so as to form a layer of a compound of copper, titanium and oxygen.

In the present embodiment, the titanium nitride layer for which TDMAT is used as the material serves as the diffusion protection layer. Since the thus formed titanium nitride layer is coarse, it is possible to form the oxide layer on the surface of the titanium nitride layer by exposing the titanium nitride layer to the atmosphere for a shorter period. In addition, the oxide layer can serve as the reaction layer that reacts with the copper layer positioned above it, and the adhesion at the interface between the copper layer and the titanium nitride layer can be improved.

Figure 13:
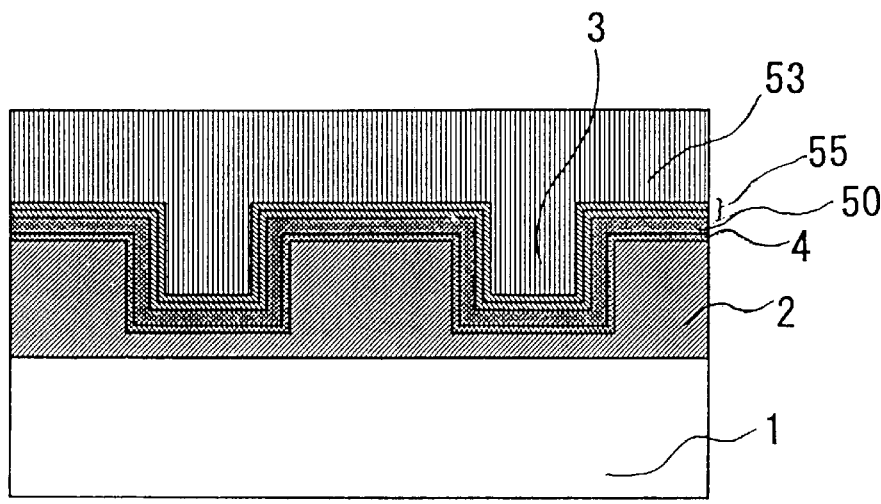
FIGS. 13A and 13B are cross-sectional views showing processes following the processes shown in FIGS. 12A–12C in the fabrication method according to the fifth embodiment of the present invention.
Figure 13:
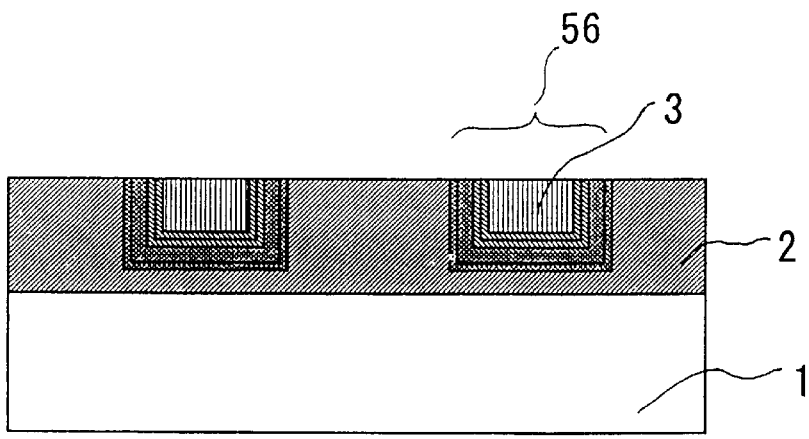

An example in which only the copper layer 52 serving as the seed layer reacts with the oxide layer 51 is shown in FIG. 13A. However, the reaction is not limited thereto. Alternatively, a part of the copper layer 53 formed by electroplating may react.

The metal layers on the insulation layer 2 are then polished by a CMP method in order to be removed, thus the surface of the insulation layer 2 is exposed. Therefore, a conductive layer 56 only remains in each groove 3. The conductive layer 56 can be used as the wiring. In the polishing process using the CMP method, the $Al_2O_3$-based slurry to which $H_2O_2$ is added as the oxidizing agent is used.

Although the present invention has been described by way of exemplary embodiments, it should be understood that many changes and substitutions may be made by those skilled in the art without departing from the spirit and the scope of the present invention which is defined only by the appended claims.

What is claimed is:

1. A fabrication process for a semiconductor device, comprising:

forming an insulation layer on a substrate;

forming a groove in the surface of the insulation layer;

forming a diffusion protection layer on the surface of the insulation layer including inside of the groove;

forming a reaction layer comprised of at least one of Ti, Zr, Al, Mg, Si, Ag, Zn, Au, P, Sn, Be, Pd, In, Pt, Mn, Ga and Ge, but which does not contain any copper, on the diffusion protection layer, forming an oxide layer on the surface of the reaction layer;

forming a layer of a wiring material on the oxide layer to embed the groove;

forming a mixture layer which is a mixture of the reaction layer, the oxide layer, and the layer of the wiring material by annealing, wherein the oxide layer controls reaction between the reaction layer and the layer of wiring material so that a part of the reaction layer and a part of the layer of wiring material react; and removing the diffusion protection layer, the mixture layer and the layer of the wiring material from the surface of the insulation layer except for the diffusion protection layer, the mixture layer and the layer of the wiring material in the groove.

2. The fabrication method of claim 1, further comprising:

forming an adhesion layer between the insulation layer and the diffusion protection layer for promoting adhesion between the insulation layer and the diffusion protection layer.

3. The fabrication method of claim 1, wherein forming the layer of the wiring material includes depositing a layer of a first wiring material on the oxide layer by sputtering; and depositing a layer of a second wiring material on the layer of the first wiring material by plating.

4. The fabrication method of claim 1, wherein removing the diffusion protection layer, the mixture layer and the layer of the wiring material except for the diffusion protection layer, the mixture layer and the layer of the wiring material in the groove is performed by chemical mechanical polishing.

5. The fabrication method of claim 1, wherein forming the oxide layer is accomplished by exposing the reaction layer to atmosphere.

6. The fabrication method of claim 1, wherein forming the oxide layer is accomplished by washing and scrubbing the reaction layer.

7. A fabrication method for a semiconductor device, comprising:

forming an insulation layer on a substrate;

forming a groove in the surface of the insulation layer;

forming a diffusion protection layer on the surface of the insulation layer including inside of the groove;

forming an alloy layer containing a wiring material on the diffusion protection layer, forming an oxide layer on the alloy layer;

forming a layer of the wiring material on the oxide layer to embed the groove;

causing the alloy layer, the oxide layer, and the layer of the wiring material to react with each other by annealing to form a reacted mass, wherein the oxide layer controls reaction between the alloy layer and the layer of wiring material so that a part of the alloy layer and a part of the layer of wiring material react; and removing the diffusion protection layer, the reacted mass, and the layer of the wiring material from the surface of the insulation layer except for the diffusion protection layer, the reacted mass, and the layer of the wiring material in the groove.

8. The fabrication method of claim 7, wherein thickness of the alloy layer is increased by the reaction of the alloy layer, the oxide layer, and the layer of the wiring material.

9. The fabrication method of claim 8, wherein the alloy layer contains two elements selected from the group consisting of the wiring material, Ti, Zr, Al, Mg, Si, Ag, Zn, Au, P, Sn, Be, Pd, In, Pt, Mn, Ga and Ge.

10. The fabrication method of claim 8, wherein the alloy layer comprises two alloys, each of which two alloys contains three elements selected from the group consisting of the wiring material, Ti, Zr, Al, Mg, Si, Ag, Zn, Au, P, Sn, Be, Pd, In, Pt, Mn, Ga and Ge.

11. A fabrication method for a semiconductor device, comprising:

forming a layer of an organic low dielectric constant material on a substrate;

forming a groove in the surface of the layer of the organic low dielectric constant material;

forming a reaction layer comprised of at least one element selected from the group consisting of Ti, Zr, Al, Mg, Si, Ag, Zn, Au, P, Sn, Be, Pd, In, Pt, Mn, Ga and Ge, but which does not contain any copper, on the surface of the layer of the organic low dielectric constant material including inside of the groove;

forming an oxide layer on the surface of the reaction layer;

forming a layer of a wiring material on the oxide layer so as to embed the groove;

forming a mixture layer which is a mixture of the reaction layer, the oxide layer, and the layer of the wiring material by annealing, wherein the oxide layer controls reaction between the reaction layer and the layer of wiring material so that a part of the reaction layer and a part of the layer of wiring material react; and removing the reaction layer, the mixture layer, and the layer of the wiring material from the surface of the layer of an organic low dielectric constant material except for the reaction layer, the mixture layer, and the layer of the wiring material in the groove.

12. A fabrication method for a semiconductor device, comprising:

forming a layer of an organic low dielectric constant material on a substrate;

forming a groove in the surface of the layer of the organic low dielectric constant material;

forming an alloy layer containing a wiring material on the layer of the organic low dielectric constant material including inside of the groove;

forming an oxide layer on the alloy layer;

forming a layer of the wiring material on the surface of the oxide layer to embed the groove;

causing the alloy layer, the oxide layer, and the layer of the wiring material to react with each other by annealing and form a reacted mass, wherein the oxide layer controls reaction between the alloy layer and the layer of wiring material so that a part of the alloy layer and a part of the layer of wiring material react; and removing the alloy layer, the reacted mass, and the layer of the wiring material from the surface of the layer of an organic low dielectric constant material except for the alloy layer the reacted mass, and the layer of the wiring material in the groove.

13. A fabrication method for a semiconductor device, comprising:

forming an insulation layer on a substrate;

forming a groove in the surface of the insulation layer;

forming a titanium nitride layer that is stabilized on the surface of the insulation layer including inside the groove to provide a stabilized titanium nitride layer;

forming a coarse titanium nitride layer on the stabilized titanium nitride layer;

oxidizing the surface of the coarse titanium nitride layer to provide an oxide layer;

forming a layer of a wiring material on the oxide layer so as to embed the groove;

forming a mixture layer which is a mixture of the oxide layer and the layer of the wiring material by annealing; and removing the stabilized titanium nitride layer, the mixture layer, and the layer of the wiring material from the surface of the insulation layer except for the stabilized titanium nitride layer, the mixture layer, and the layer of the wiring material in the groove.

14. The fabrication method of claim 13, wherein forming the stabilized titanium nitride layer is accomplished by repeatedly depositing titanium nitride to obtain a titanium nitride layer having a preselected thickness by CVD and stabilizing the titanium nitride layer by plasma treating the surface of the titanium nitride layer, and wherein forming the coarse titanium nitride layer is accomplished by depositing titanium nitride by CVD.

15. The fabrication method of claim 14, wherein forming the coarse titanium nitride layer by CVD employs tetra-dimethyl-amido titanium as a material for the CVD deposition.

16. A fabrication process for a semiconductor device, comprising:

forming an insulation layer on a substrate;

forming a groove in the surface of the insulation layer;

forming a first conductive layer comprised of at least one of Ti, Zr, Al, Mg, Si, Ag, Zn, Au, P, Sn, Be, Pd, In, Pt, Mn, Ga and Ge, but which does not contain any copper, on the insulation layer, forming an oxide layer on the surface of the first conductive layer;

forming a second conductive layer on the oxide layer so as to embed the groove;

forming a mixture layer which is a mixture of the first conductive layer, the oxide layer, and the second conductive layer by annealing, wherein the oxide layer controls reaction between the first conductive layer and the second conductive layer so that a part of the first conductive layer and a part of the second conductive layer react; and removing the mixture layer and the second conductive layer from the surface of the insulation layer except for the mixture layer and the second conductive layer in the groove.

17. A fabrication method for a semiconductor device, comprising:

forming an insulation layer on a substrate;

forming a groove in the surface of the insulation layer;

forming an alloy layer containing a wiring material on the insulation layer;

forming an oxide layer on the alloy layer;

forming a conductive layer on the oxide layer so as to embed the groove;

causing the alloy layer, the oxide layer and the conductive layer to react with each other by annealing to form a reacted mass, wherein the oxide layer controls reaction between the alloy layer and the conductive layer so that a part of the alloy layer and a part of the conductive layer react; and removing the reacted mass and the conductive layer from the surface of the insulation layer except for the reacted mass and the conductive layer in the groove.

* * * * *